United States Patent [19]
Ramm et al.

[11] Patent Number: 5,192,578
[45] Date of Patent: Mar. 9, 1993

[54] METHOD OF PRODUCING COATING USING NEGATIVE DC PULSES WITH SPECIFIED DUTY FACTOR

[75] Inventors: Jürgen Ramm, Flaesch; Helmut Daxinger, Wangs; Rainer Buhl, Sargans; Erich Bergmann, Mels, all of Switzerland

[73] Assignee: Balzers AG, Furstentum, Liechtenstein

[21] Appl. No.: 613,390

[22] Filed: Nov. 14, 1990

[30] Foreign Application Priority Data

Nov. 22, 1989 [CH] Switzerland ............. 4192/89

[51] Int. Cl.⁵ .............................................. B05D 3/06
[52] U.S. Cl. ................................ 427/576; 427/580; 427/564
[58] Field of Search .................. 427/37, 38, 42, 39

[56] References Cited

U.S. PATENT DOCUMENTS

| | | | |
|---|---|---|---|
| 4,428,808 | 1/1984 | Weinert et al. | 427/38 |
| 4,540,596 | 9/1985 | Nimmagadda | 427/37 |
| 4,596,719 | 6/1986 | Pinkhasov | 427/37 |
| 4,673,477 | 6/1987 | Ramalingam et al. | 427/37 |
| 4,729,905 | 3/1988 | Zhed et al. | 427/37 |
| 4,842,710 | 6/1989 | Freller et al. | 427/37 |
| 5,015,493 | 5/1991 | Gruen | 427/37 |
| 5,108,984 | 4/1992 | Shioya et al. | 427/42 |

FOREIGN PATENT DOCUMENTS

| | | |
|---|---|---|
| 0043781 | 1/1982 | European Pat. Off. . |
| 0166708 | 6/1985 | European Pat. Off. . |
| 0209137 | 1/1987 | European Pat. Off. . |
| 3428951 | 2/1986 | Fed. Rep. of Germany . |
| 3543316 | 9/1986 | Fed. Rep. of Germany . |
| 3700633 | 1/1987 | Fed. Rep. of Germany . |
| 2393079 | 12/1978 | France . |

OTHER PUBLICATIONS

Ahmed et al., 4 EME Collogue Intern. Sur Les Plasmas et La Pulverization 13–17 Sep. 1982.
Tatsuo O Mori, Japanese Abstract, vol. 13, #134 (C-581) Apr. 4, 1989, Ap #63-297551, "Ion Current Forming Device".
Masayasu Nigami, "Film Forming Device", Japanese Abstract, vol. 13, #134 (C-581) Apr. 4, 1989 Ap. #63-297552.

Primary Examiner—Marianne Padgett
Attorney, Agent, or Firm—Notaro & Michalos

[57] ABSTRACT

For coating workpieces having basic bodies (3), with a ceramic, electrically non-conducting material, during the coating process a pulsating dc voltage is applied to the basic bodies (3) or their holders (36). Preferably the pulse height is changed during vaporization used for the coating process, from high negative values to smaller negative values. A further layer can be applied onto the workpieces coated in this way whereby these workpieces, due to their excellent corrosion resistance, are suited as pieces of jewelry which can be exposed in particular to ocean water and body perspiration, as rolling bodies in which the use of oil or grease as corrosion protection can be dispensed with, and as separating and cutting tools for organic materials.

10 Claims, 1 Drawing Sheet

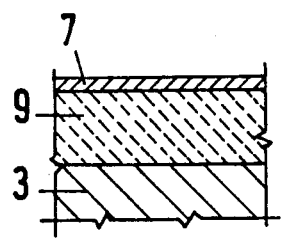
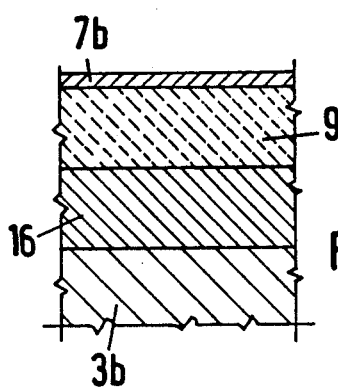
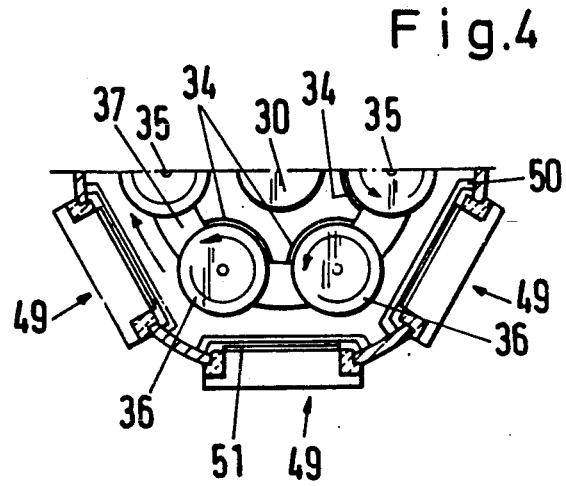
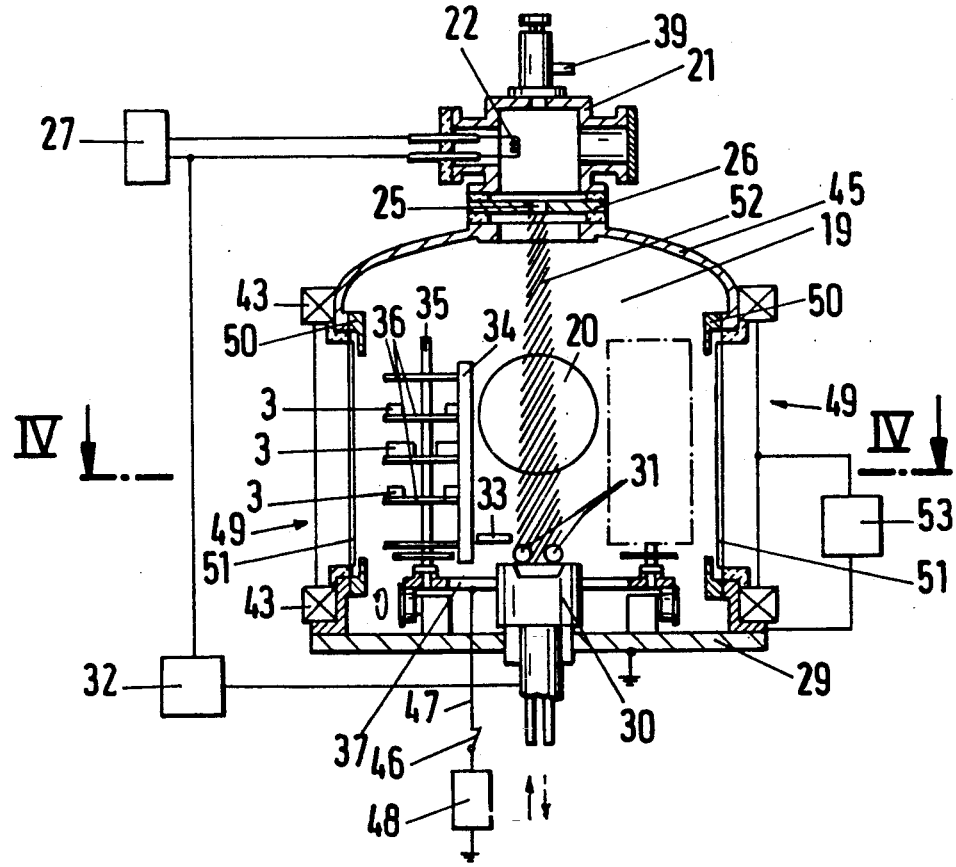

METHOD OF PRODUCING COATING USING NEGATIVE DC PULSES WITH SPECIFIED DUTY FACTOR

FIELD AND BACKGROUND OF THE INVENTION

The present invention relates to a method for the production of a coating and a workpiece coated by the method.

The application of a ceramic layer of oxides, nitrides, oxynitrides, and carbides on a workpiece (substrate) is known from Swiss CH-P 664 163. In the known method, a low-voltage arc is used to evaporate an oxide or nitride former which is held in a crucible in a vacuum chamber, and with a nitrogen or oxygen atmosphere in the chamber. The workpiece is electrically insulated on a holder. Due to the electrical gas discharge maintained during the operation of the installation, the holder with the workpieces was charged to a negative potential during the condensation of the vapor with the effect that positive ions are accelerated from the active vapor and the residual gas (plasma) toward the workpieces.

A further method for applying a ceramic boron nitride layer is known from the publication by K. Inagawa et al., "Preparation of cubic boron nitride film by activated reactive evaporation with a gas activation nozzle", *J. Vac. Sci. Technol. A* 5 (4), Jul/Aug. 1987, pp. 2696-2700. A positive potential is applied to a gas inlet opening in order to activate the reactive gas used for the generation of the ceramic layer. Further an ac voltage in the ten megahertz range is applied to the workpieces in order to accelerate the ions of the introduced gas toward the workpieces.

With the known method it is possible to apply insulating layers onto conducting layers. It is also possible to apply insulating layers onto only electrically insulated substrates, however, the capacity of adherence is less than desirable. If the workpieces are worked with an ac bias voltage then a sufficiently high-frequency shielding of the installation must be ensured; likewise the terminating wave impedance which changes with the shape, size and number of the work-pieces, must be matched in a time-consuming procedure to that of the generator for generating the ac voltage.

SUMMARY OF THE INVENTION

The present invention is based on the task of creating a well adhering coating on a basic body of a workpiece wherein this coating can also serve as a separating layer for a superior layer applied on it and the basic body through this separating layer is usable in an aggressive, corrosive environment.

Accordingly, an object of the present invention is to provide a method for producing a coating with a ceramic, electrically non-conducting material on a surface of a basic body of a workpiece, which is insulated relative to a vacuum chamber, and wherein, in a first process step, an oxide and/or nitride former is converted into the gaseous state and is at least partially ionized, and in a second process step, nitrogen and/or oxygen is introduced and at least partially ionized whereupon a ceramic layer is deposited on the surface of the basic body which is a compound of the oxide or nitride former and the nitrogen or oxygen. During the second process step, pulsating dc voltage is applied to the basic body and/or to its holder, which in effect also applies the dc voltage to the basic body.

BRIEF DESCRIPTION OF THE DRAWINGS

In the following an example of the method according to the invention will be explained in greater detail in conjunction with the production of a decorative coating with reference to the drawings. The production of coatings by example for the use of the workpieces as cutting or separating tools for organic material as well as rolling bodies is explained subsequentially. In the drawings:

FIG. 1 is a schematic section through a coating with decorative layer and ceramic separating layer of a workpiece, FIG. 2 is a schematic section through a coating with decorative layer, ceramic separating layer and galvanic layer, FIG. 3 is a section through a schematically represented vapor deposition installation, and FIG. 4 is a section through the vapor deposition installation in FIG. 3 taken along line 4—4, wherein because of axial symmetry, only one half of the vapor deposition installation is shown.

DESCRIPTION OF THE PREFERRED EMBODIMENTS

The decorative layer 7 shown in FIG. 1 is disposed on a separating layer 9 of an electrically non-conducting ceramic material over the surface of a basic body 3 of a work piece 1. The separating layer 9, applied according to the method described below, is radiographically amorphous, i.e. upon irradiation with an X-ray it shows on the side of the separating layer 9 facing away from the X-ray source an only approximately Gaussian intensity distribution with a radiation maximum in the ray center; no far field order (no Debye-Scherrer diagram) can be recognized. A radiographically amorphous coating is achieved through a low coating temperature. A low coating temperature results in that the electrical power used in the method described below are kept so low that no crystal formation takes place.

The decorative layer 7, as the uppermost layer, comprises essentially gold. The separating layer 9 comprises an electrically non-conducting ceramic material whose layer thickness, depending on the material used and the field of application, is between 0.2 and 5 $\mu$m. Ceramic material here means a chemical compound known in its solid form as ceramic i.e. the structure of the separating layer 9 can consequently also be amorphous. The separating layer 9 comprises essentially silicon nitride $Si_3N_4$ and silicon oxide $SiO_2$, as described below.

FIG. 3 is a schematic representation of a vapor deposition installation by example for the generation of a decorative coating with the method according to the invention. The vapor deposition installation has a vacuum chamber 19 with an evacuation port 20 and a thermionic cathode chamber 21 with a thermionic cathode 22 which is connected via an opening 25 with the vacuum chamber 19. The bottom 26 of the thermionic cathode chamber 21 containing the opening 25 is electrically insulated relative to the walls of the vacuum chamber 19. The thermionic cathode 22 is fed by a current supply unit 27. A coolable crucible 30 is positioned below the opening 25 and above the bottom 29 of the vacuum chamber 19. The coolable crucible 30 contains silicon 31 as a nitride former. The silicon 31 can be covered with a slidable screen 33. In the vacuum chamber 19, six electrically conducting supports 35 which are each rotatable about their longitudinal axis, are disposed. Of these, four are indicated in FIG. 4 on which the basic bodies 3 of steel to be coated are held on one holder 36 each. The supports 35 are rotatably about the chamber axis on a rotary table 37 and through it, are electrically connected to each other. The rotary table 37 is electrically insulated relative to the bottom 29 and the walls of the vacuum chamber 19. The holders 36 are connected in an electrically conducting manner, to the supports 35. The basic bodies 3, held on the holders 36, are coverable with a screen 34 schematically represented in FIGS. 3 and 4 opposite the silicon 31 in the crucible 30.

A gas feed line 39 terminates in the thermionic cathode chamber 21. Gas feed line 39 is connected via the opening 25 to the vacuum chamber 19. One schematically represented magnetic coil 43 is disposed just above the bottom 29 and another coil 43 adjoins a cover 45 of the vacuum chamber 19 for generating an approximately parallel vertical magnetic field.

The rotary table 37 is connected via a sliding contact (not shown), an electrical line 47, and a closed switch 46 to a variable voltage generator 48 whose other pole is at ground.

Six devices 49 are placed in the vertical walls of the vacuum chamber 19, for cathode sputtering. Three are represented in FIG. 4. Each device 49 is provided with a heat exchanger for cooling (not shown). A target 51 is positioned within an annulus 50 and is insulated from the annulus. The target is connected to the negative pole of a voltage source 53. The positive pole of the voltage source 53 is connected to the walls of the vacuum chamber 19 and to the annulus 50. The thermionic cathode 22 and the crucible 30 are connected via electrical lines to current supply units 27 and 32.

For the production of the above coating the basic bodies 3 are fastened to the holders 36 of the supports 35 and silicon 31 is placed in the crucible 30. Subsequently the vacuum chamber 19 is closed, evacuated and the surfaces of the objects 3 to be coated heated with a low-voltage arc 52 corresponding to a method described in German DE-OS 34 06 953 or Swiss CH-P 658 545 and purified according to a method described in Swiss CH-P 631 743. During this time, the screen 33 covers the silicon 31 in the crucible 30.

To melt the silicon 31 the screen 33 is slid in such a way that the silicon 31 is exposed. The screen 34 is folded in front of the basic bodies 3 as shown in FIG. 3 in order to avoid a coating of silicon with these melts. The low-voltage arc 52 burns now from the thermionic cathode 22 to the silicon 31 in crucible 30 with an arc voltage of 90 V and a current of 60 A wherein, upon reaching the melting point, the voltage decreases to 70 V and the current to 200 A due to the increased conductivity of the silicon 31 which increases with the temperature.

In a following first process step the magnitude of the current of the low-voltage arc 52 is maintained at 200 A at an arc voltage of 70 V. Hereby the silicon 31 from the crucible 30 is converted into the gaseous state and partially ionized.

In a second process step nitrogen is introduced through the gas feed line 39 into the argon atmosphere which is partially ionized by the low-voltage arc 52. Simultaneously the screen 34 in front of the basic body 3 is folded away. The partially ionized nitrogen and the partially ionized silicon combine to form $Si_3N_4$ on the surface of the basic body 3 and adhere to it. During this process step also the basic bodies 3 rotate.

During this second process step the partial pressure of argon is $4*10^{-2}$ Pa and that of the nitrogen $3*10^{-2}$ Pa. A pulsating dc voltage with a period of 10 $\mu s$ applied to the supports 35 and thus to the basic bodies 3. At the beginning of this method step the voltage generator 48 supplies negative pulses with a duty factor of 80%, e.g. the pulse width of the negative pulses is 8 $\mu s$ at a period of 10 $\mu s$. In the 2 $\mu s$ following the 8 $\mu s$ the supports 35 are at ground via the voltage generator 48. The pulse height at the beginning of the process is $-200$ V and is decreased during this process step to lower negative values in such a way that toward the end they are $-10$ V.

According to the invention the pulse duty factor should be 20% to 90% with a period of a few microseconds and preferably 60% to 90% of the period.

When a layer the separating layer 9 of 1 $\mu m$ has been applied, the silicon 31 disposed in the crucible 30 is covered, the low-voltage arc 52 and the voltage generator 32 are switched off, the switch 46 is opened and the nitrogen inflow interrupted. The voltage source 53 is switched on and hereby the process of sputtering the gold from the target 51 is set into motion. The basic bodies 3 are electrically floating, When a layer thickness of gold of 200 Å has been deposited on the separating layer 9, the voltage source 53 is switched off. The vacuum chamber 19 is vented and subsequently opened to remove the decoratively coated objects 3.

Instead of gold other materials can also be sputtered as decorative layer 7 such as for example silver or TiOCN for a black coating. The material of the decorative layer 7 can also be vaporized by means of ion plating with the low-voltage arc 52 subsequently to the vaporization of silicon 31. In this case, a crucible with silicon (not shown) and a further material, for example titanium, is used for the production of a gold-colored titanium nitride layer. The material in the crucible, which in each instance is not to be vaporized, is in that case covered with screen 33. Instead of titanium other metals can also be vaporized which then are oxidized in an oxygen atmosphere instead of a nitrogen atmosphere to form colored metal oxides.

The decorative layer 7 is primarily gold and silver layers with a layer thickness of at least 100 Å or gold-colored laminar coatings comprising essentially nitrides of elements of group IVb (titanium, zirconium, molybdenum, tungsten) as described in German DE-P 37 28 836. But a hard material layer into which gold is embedded, during the coating process can also be used. Hard material coatings with embedded colored metal oxides or colored metal oxide alone, are also used. The hard material layer comprises essentially a nitride, carbide, oxynitride, boride of an element of group IVb, Vb or VIb of the periodic system or of silicon or their mixtures; it is also possible to use a hard material layer comprising essentially hard carbon iC.

It is also possible for ion plating to take place simultaneously with the sputtering of the gold or of another material whereupon a mixed layer is formed as decorative layer 7.

For generating a black decorative layer with for example titanium carbide embedded in an iC matrix by means of an arc discharge in a PVD process, titanium is vaporized in a reactive atmosphere that gives off carbon (for example acetylene) wherein toward the end of the vaporization process the partial pressure of the gas for giving off carbon is increased for the generation of the iC matrix.

The material of the ceramic separating layer 9 can also be converted into the gaseous state with an electron beam, through cathode sputtering, plasma enhanced vaporization or cathode arc vaporization.

Instead of using $Si_3N_4$ for the ceramic separating layer 9 $SiO_2$ or $Si_xO_6N_z$ can also be used. The ceramic separating layer 9 of $SiO_2$ or $Si_xO_yN_z$ is applied analogously to the method already described above. With ceramic separating layers 9 of $Si_xO_yN_z$ the process is carried out at a partial pressure of argon of $3*10^{-2}$ Pa, oxygen $1*10^{-2}$ Pa, and nitrogen $3*10^{-2}$. A separating layer 9 can also comprise an oxide and/or nitride of aluminum, an oxide of an element of group IVb (titanium, zirconium, hafnium), Vb (vanadium, niobium, tantalum), VIb (chromium, molybdenum, tungsten) or mixtures of these substances or mixtures of these substances with an oxide, nitride or oxynitride of silicon.

Instead of grounding the pole of the voltage generator 48 which is not connected with line 47, it can also be connected to the crucible 30 or to the anode potential of the low-voltage arc 52. Instead of changing the pulse height from $-200$ V to $-10$ V, the pulse width can also be decreased; it is also possible to change the pulse height and the pulse width.

In a variant of the vapor deposition installation the holders of the basic bodies are insulated with respect to each other and with respect to the vacuum chamber 19. They are connected directly via a contact and an electrical line (not shown) to the variable voltage generator 48.

Instead of introducing nitrogen through the gas feed line 39 a separate line (not shown) can also be used at another location of the vacuum chamber 19.

The screen 33 is produced from an electrically insulating material or held insulated relative to the vacuum chamber 19 and the crucible 30. But it can also comprise a material with a high-ohmic electrical resistance or be coated with a high-ohmic material coating or be high-ohmically connected to the vacuum chamber 19 in order to avoid, to a large extent, an electrical charge, but also for reasons of safety.

If by means of the arc discharge 52 sequentially two or more different materials are converted into the gaseous state, instead of screen 33 several crucibles referred to as alternating crucibles electrically insulated relative to each other and relative to the vacuum chamber 19 can also be used which, depending on need, are connected to the one pole of the voltage source 32 as an electrode for the arc discharge. In addition to the production of the particular electrical connection the particular alternating crucible can also be placed at a site that is advantageous for the arc discharge and the coating rate.

With a basic body 3b of brass analogous to the basic body 3 a galvanic layer 16 of nickel is, as represented in FIG. 2, deposited with a layer thickness of 2 μm directly on the surface of the basic body 3b. The galvanic layer 16 is applied on the surface of the basic body 3b immediately after its completion and surface purification in order to avoid later tarnishing during the fabrication and transport process. Above this galvanic layer 16 is deposited a ceramic separating layer 9b corresponding to the ceramic separating layer 9 and above this a decorative layer 7b corresponding to the decorative layer 7 is deposited.

Coating here takes place analogously to the methods already described above with the difference that here not the surface of the basic body 3 but rather the galvanic layer 16 adhering to it, is purified.

In the case of the basic bodies 3 coated according to the invention, the ceramic separating layer drastically increases specifically corrosion resistance. This result is surprising specifically since until now in layers applied by means of PVD "pin holes" were observed which counteract corrosion resistance.

Since in the basic bodies 3 coated according to the invention the hard layer is underneath the decorative layer, the separating layer 9 can indeed receive tears in the event of a hard impact on the basic body, however, these tears remain invisible since they are covered by the decorative layer 7. The decorative appearance is consequently not influenced.

If great and rapid temperature fluctuations occur during the use of a decoratively coated object, then on the basic body 3 in addition to a decorative layer analogous to the decorative layer 7 and a ceramic separating layer analogous to the ceramic separating layer 9, an additional layer is applied underneath the ceramic separating layer. The thermal coefficient of expansion of the material used is between that of the basic body 3 and that of the ceramic separating layer. The coefficient of expansion of the decorative layer need not be taken into consideration since it is thinner than the ceramic separating layer.

With a decorative layer of a thickness of 200 Å of gold, a 1 μm thick ceramic separating layer of $Si_3N_4$, and a basic body 3 of steel, St 37 for example, a 0.5 μm thick thermal separating layer of $SiO_2$ is applied.

The thermal separating layer is applied analogously to the above described methods in an analogous or identical vapor deposition installation.

However, immediately after purification and heating, not nitrogen but rather oxygen is introduced and also silicon is vaporized with the low-voltage arc. $SiO_2$ is deposited on the surface of the basic bodies 3. The operation takes place with a partial pressure of oxygen at $4*10^{-2}$ Pa, a partial pressure of argon at $3*10^{-2}$ Pa, and a voltage of the low-voltage arc 52 of 65 V at a current of 160 A. When a layer thickness of 0.5 μm has been grown, the oxygen inflow is stopped and nitrogen is introduced and the process continued according to the above described method with the above stated data for the low-voltage arc 52. To the supports 35 likewise a pulsed dc voltage with a period of approximately 10 μs is applied wherein at the beginning of this process step the voltage generator 48 supplies negative pulses with a pulse width of 8 μs and an amplitude of $-200$ V and toward the end of the coating process of $SiO_2$ and $Si_3N_4$, an amplitude of $-10$ V. In each instance, supports 35 are grounded during the following 2 μs.

If instead of the decorative layer 7 a hard coating is applied, which comprises essentially a compound of nitrogen, carbon or boron with a metal of groups IVb, Vb, VIb or of silicon carbide or mixtures of these substances, then the workpieces coated in this way are highly suitable as tools or instruments for cutting and/or separating organic material. The tools can be used in particular as vulcanization forms, synthetic injection molding forms, knives for working meat and as surgical instruments which, in addition, have an excellent resistance against disinfectants and sterilization processes. Objects coated in this way can also be used with excellent characteristics as implants in the human body.

Instead of the decorative layer 7 a sliding layer can also be applied and the workpieces coated in this way can be used as rolling bodies. The sliding layer comprises a mixture of particles which are sputtered on, and which are of at least a metallic substance forming a combined matrix and at least one type of substance made of metallic particles with a statistical diameter of less than 0.8 μm and a lower melting point than the matrix substance. The substance particles in the solid state are practically not soluble in the material of the matrix. The material particles which are insoluble in the matrix, comprise essentially tin, lead, indium or zinc. The material forming the matrix is an alloy comprising essentially aluminum, chromium, nickel, magnesium or copper. As a sliding layer, further metallic chalcogenides (for example niobium diselenide, molybdenum disulfide, tungsten disulfide) can also be used. The sliding layer has a thickness corresponding to two or ten times that of the separating layer 9 and is applied preferably by means of cathode sputtering. Because of the excellent corrosion protection through the separating layer 9 in the rolling bodies coated according to the invention, the use of oil or grease for corrosion protection, can be dispensed with. The high surface pressure required of rolling bodies is given in the rolling bodies according to the invention.

If the basic bodies do not, as described above, comprise an electrically conducting material but rather an insulating material such as for example glass, the period of the pulsating dc voltage applied to the holders 36 of the basic bodies is decreased or replaced with an ac voltage of appropriately high frequency (approximately 13 MHz).

Since in the above described method according to the invention the process takes place with a pulsating dc voltage instead of an ac voltage, the time during which the ions fall onto the workpiece can be adjusted by changing the clock time and be optimally adapted; the energy with which the ions are "attracted" is likewise adjustable.

From a machine-technology aspect a vapor deposition installation working with pulsating dc voltage can be implemented more simply since a shielding of the feed line of the pulsating dc voltage to the work pieces, in contrast to the known ac voltage, can be omitted. The time-consuming readjustment of the terminating impedance of the electrical feed line also is superfluous when using the pulsating dc voltage. When using an ac voltage the terminating impedance resulting from the type of workpieces, the holders and their numbers, can be matched to the wave impedance of the feed line cable in order to avoid power dissipation to achieve maximum amplitude values at the workpieces and in order not to overload the ac voltage generator.

What is claimed is:

1. A method for the production of a coating made of a ceramic, electrically non-conducting material, on a surface of a workpiece, comprising:
    placing the workpiece in, and insulating the workpiece from a vacuum chamber;
    a first process step wherein at least one of an oxide and nitride former, acting as at least one first material, is converted into a gaseous state and is at least partially ionized in the vacuum chamber using a first electrical voltage;
    a second process step wherein at least one of nitrogen and oxygen, acting as at least one second material, is introduced into and at least partially ionized in the vacuum chamber using the first electrical voltage; and
    at least during the second process step, applying a second voltage to the workpiece for depositing at least one of an electrically non-conducting oxide, nitride, and oxinitride layer on the surface of the workpiece, the second voltage being a negative pulsating dc voltage having a period and a pulse duty factor, the period being a few microseconds and the pulse duty factor being between 60 and 90% of the period.

2. A method as stated in claim 1, wherein the period of the pulsating dc voltage is approximately 10 microseconds.

3. A method as stated in claim 1, wherein a pulse height of the pulsating dc voltage starting with a high negative voltage value is changed to a low negative value and the workpiece, between pulses, is at ground potential or at the potential of the oxide or nitride former which has not yet been converted into the gaseous state.

4. A method as stated in claim 1, including generating an arc discharge in the vacuum chamber using an anode potential to convert the oxide or nitride former into the gaseous state, a pulse height of the pulsating dc voltage starting with a high negative value and being changed to a low negative voltage value and the workpiece, between pulses, being at the anode potential.

5. A method as stated in claim 1, wherein the deposited layer comprising a compound of the oxide or nitride former and at least one of nitrogen and oxygen is formed as a separating layer, and including, in a third process step, depositing a surface layer on the separating layer.

6. A method as stated in claim 1, wherein the conversion of the oxide or nitride former into the gaseous state and the at least partial ionization thereof as well as the at least partial ionization of the nitrogen or oxygen, is achieved by using an arc discharge 3.

7. A method as stated in claim 5, wherein the oxide or nitride former and a material to be converted into the gaseous state in the third process step for the formation of the surface layer, is placed into one depression each of a crucible connected as an electrode for an arc discharge in the vacuum chamber, during the second process step, the material for the formation of the surface layer being covered by a screen, and during the third process step the oxide or nitride former being covered by the screen so that during the second process step, only the oxide or nitride former and during the third process step only the material for the surface layer is converted into the gaseous state by means of the arc discharge.

8. A method as stated in claim 5, wherein the oxide or nitride former and a material to be converted into the gaseous state in the third process step for the formation of the surface layer are placed into an alternate crucible and the alternate crucible with the oxide or nitride former during the second process step and the alternate crucible with the material for the formation of the surface layer (7) during the third process step is switched as an electrode of an arc discharge in the vacuum chamber in order that during the second process step only the oxide or nitride former and during the third process step only the material is converted into the gaseous state by means of the arc discharge.

9. A method as stated in claim 7, wherein a low-voltage arc is used as the arc discharge.

10. A method as stated in claim 8, wherein a low-voltage arc is used as the arc discharge.

* * * * *